US005530720A

United States Patent [19]

Marguinaud

[11] Patent Number: 5,530,720
[45] Date of Patent: Jun. 25, 1996

[54] METHOD OF CALCULATING WEIGHTING COEFFICIENTS FOR AN ANALYTICAL DIGITIZER FOR SIGNAL PROCESSING, AND ANALYTICAL DIGITIZER

[75] Inventor: André Marguinaud, Palaiseau, France

[73] Assignee: Alcatel Espace, Courbevoie, France

[21] Appl. No.: 269,686

[22] Filed: Jul. 1, 1994

[30] Foreign Application Priority Data

Jul. 1, 1993 [FR] France .................................. 93 08067

[51] Int. Cl.$^6$ .............................. H03H 7/30; H03H 7/40; H03K 5/159
[52] U.S. Cl. ....................................... 375/232; 364/724.01
[58] Field of Search ....................................... 375/230–235, 375/349, 350, 243, 245; 364/724.01, 724.19, 724.20, 735, 736, 754, 758, 759

[56] References Cited

U.S. PATENT DOCUMENTS 4,843,581  6/1989  Cupo et al. ..
5,432,725  7/1995  Bond ........................................ 375/232

Primary Examiner—Stephen Chin
Assistant Examiner—Hai H. Phan
Attorney, Agent, or Firm—Sughrue, Mion, Zinn, Macpeak & Seas

[57] ABSTRACT

An analytical digitizer for signal processing includes a sampler and an analog/digital converter. A first calculating device supplies a first component of the signal made up of a sequence of digital values. Each value is calculated by adding 2h+2 value supplied by the converter weighted with respective non-null integer coefficients $a_0, \ldots, a_h, a_h, \ldots, a_0$. A second calculating device supplies a second component of the signal, in phase quadrature to the first, and made up of a sequence of digital values y(t). Each of these values is calculated by adding 2h+2 values supplied by the converter weighted with respective non-null integer coefficients $b_0, \ldots, b_{h-1}, -b_{h-1}, \ldots, -b_0$. The number and the value of the coefficients are determined by a rigorous method according to the center frequency and the bandwidth of the spectrum of the signal to be processed and according to a fixed limit value for the signal/noise ratio. The device finds an application in radio surveillance receivers.

7 Claims, 3 Drawing Sheets

METHOD OF CALCULATING WEIGHTING COEFFICIENTS FOR AN ANALYTICAL DIGITIZER FOR SIGNAL PROCESSING, AND ANALYTICAL DIGITIZER

BACKGROUND OF THE INVENTION

1. Field of the Invention

The invention concerns a method of calculating weighting coefficients used in an analytical digitizer for signal processing. A known technique in the field of telecommunications and sensing is to process a real signal after digitizing it analytically, i.e. after representing it by a sequence of complex samples. The complex samples can be represented in Cartesian co-ordinates (x, y) or in polar co-ordinates (r, θ), the temporal increment of which depends only on the bandwidth of the signal represented. The Cartesian form of representation is more advantageous for frequency filtering whereas the polar form is more advantageous for frequency conversion and phase or frequency estimation.

2. Description of the Prior Art

A prior art analytical digitizer implemented in analog components has two channels each including a modulator, a filter, an amplifier and a sampler. An oscillator supplies two sinusoidal signals in phase quadrature to respective modulators which also receive the signal to be processed. The frequency of this oscillator is usually variable so that it is possible to compensate for frequency drift or to obtain a baseband signal. This type of digitizer requires the provision of two channels which are as closely identical as possible, with regard to the filter characteristics, the gain, and the characteristics of the sampler and the analog-digital converter. This balance between the two channels is difficult to achieve and calls for a large number of components.

To avoid this problem of balancing two channels, other types of analytical digitizer determine the values of the two components in phase quadrature using a single sampler and a single analog-digital converter followed by two digital channels which perform different processing. There is no longer any balancing problem as the two components can be determined from the same sequence of sample values. The article "Digital Processing for Positioning With One Satellite" by A. Marguinaud, published by Advisory Group for Aerospace Research and Development, 7 rue Ancelle 92200 Neuilly sur Seine, France, describes an analytical digitizer in which the two digital channels comprise two finite impulse responses filters. This digitizer uses a method based on uniform representation of any continuous signal by a sum of trigonometrical functions, in accordance with the Weierstrass theorem: The real component x(t) and the quadrature component y(t) of any continuous real signal can be represented as follows:

$$x(t) = \sum_{j=0}^{n} A_j \cdot \cos(\bar{j\omega}t + \phi j) \quad (1)$$

$$Y(t) = \sum_{j=0}^{n} B_j \cdot \sin(\bar{j\omega}t + \phi j)$$

where n depends only on the tolerable error between the real signal and its approximation.

In the case of limited bandwidth signals, sampling theory allows the angular frequencies jω to be replaced by their value modulo $$\frac{1}{4\pi\Delta t},$$

where Δt is the sampling time increment. As a result, the only components to be taken into account in the theoretical considerations are in the physical band. In practise, this applies whenever the sampler is preceded by a bandpass filter.

This article teaches that an analytical digitizer is particularly simple to implement if the filters process only four samples and the center frequency of the signal to be processed is equal to one quarter of the sampling frequency. It gives values of the coefficients $a_0$, $a_1$, $b_0$, $b_1$. The two filters then calculate the two components from the following equations:

$$\begin{cases} x(t) = a_0 \left[ r\left(t + \frac{\Delta t}{2}\right) + r\left(t - \frac{\Delta t}{2}\right) \right] + a_1 \left[ r\left(t + \frac{3\Delta t}{2}\right) \right] + r\left(t - \frac{3\Delta t}{2}\right) \right] \\ y(t) = b_0 \left[ r\left(t - \frac{\Delta t}{2}\right) - r\left(t + \frac{\Delta t}{2}\right) \right] + b_1 \left[ r\left(t - \frac{3\Delta t}{2}\right) \right] - r\left(t + \frac{3\Delta t}{2}\right) \right] \end{cases} \quad (2)$$

where
$a_0 = 3$
$b_0 = 3$
$a_1 = -1$
$b_1 = 1$

This article also teaches that the noise due to digitization of the signal and to the calculations carried out by the filters, referred to as quadrature noise, is such that the signal/noise ratio is 20 dB if the bandwidth is equal to one quarter of the signal center frequency or 30 dB if the signal bandwidth is equal to half the signal center frequency.

The article "Traitement Analytique du Signal" by A. Marguinaud, published by the French Ministry of Defense (Ministére de la Défense; Direction Génerale de l'Armement Direction des Recherches, Etudes et Techniques; 4 rue de la Porte d'Issy, 75015 Paris); teaches that the weighting coefficients must be limited to symmetrical coefficients $a_0, \ldots, a_h, a_h, \ldots, a_0$ for a first component of the signal and anti-symmetrical coefficients $b_0, \ldots, b_h, -b_h, \ldots, -b_0$ for the second component.

This article also suggests determination of the coefficients which are matched to the spectrum of the signal to be processed.

A heuristic method which carries out a simulation on a computer determines weighting coefficients for four or even six samples but a heuristic method does not yield coefficient values of sufficient accuracy if the number of samples is greater than six.

An object of the invention is to propose a method of calculating coefficients for an analytical digitizer including two finite impulse response filters for processing more than four samples, weighting them by coefficients determined by a rigorous general method so that it is possible to optimize the quadrature signal/noise ratio and the complexity of the implementation of the digitizer for each application, i.e. according to the spectrum of the received signal and the quadrature signal/noise ratio required for that application.

Another object of the invention is to propose an analytical digitizer in which the number and the value of the weighting coefficients vary automatically according to the characteristics of the signal received for applications such as radio surveillance receivers in which the characteristics of the signal received are not constant.

SUMMARY OF THE INVENTION

In a first aspect, the invention consists in a method of calculating weighting coefficients for an analytical digitizer for signal processing, said digitizer comprising:

means for sampling an analog signal to be processed and for converting the analog value of each sample into a digital value;

first calculating means supplying a sequence of digital values x(t) each calculated by adding 2h+2 values supplied by the digitizing means weighted by respective non-null integer coefficients $a_0, \ldots, a_h, a_h, \ldots, a_0$;

second calculating means supplying a sequence of digital values y(t) each calculated by adding 2h+2 values supplied by the digitizing means weighted by respective non-null integer coefficients $b_0, \ldots, b_h, -b_h, \ldots, -b_0$;

means for supplying to said first and second calculating means the values of the coefficients $a_0, \ldots, a_h, b_0, \ldots, b_h$;

wherein, for a digitizer calculating pairs of values x(t), y(t) at a fixed rate Fe for a signal having a predetermined center frequency Fc and bandwidth B and for a predetermined number h, the calculation of the coefficients $a_0, \ldots, a_h$ and $b_0, \ldots, b_h$ consists in:

replacing the trigonometrical lines $\cos(2i+1)\theta$ and $\sin(2i+1)\theta$ for $i=0, \ldots, h$, respectively, by standard polynomial expressions of the respective form:

$$Cos(2i+1)\theta = (-1)^i (Cos\theta).Q_i[(Cos\theta)^2]$$

$$Sin(2i+1)\theta = (Sin\theta).Q_i[(Sin\theta)^2]$$

where $Q_i$ is a standard ith degree polynomial, in the following polynomials:

$$Gx = a_0 \cos \theta + a_1 \cos 3\theta + \ldots + a_i \cos(2i+1)\theta + \ldots + a_h \cos(2h+1)\theta$$

$$Gy = b_0 \sin \theta + b_1 \sin 3\theta + \ldots + b_i \sin(2i+1)\theta + \ldots + b_h \sin(2h+1)\theta$$

to obtain two polynomials called the relative gains of the first and second calculating means, in the form:

$$Gx = (Cos\theta) \cdot \sum_{i=0}^{h} (-1)^i \cdot a_i \cdot Q_i[(Cos\theta)^2]$$

$$Gy = (Sin\theta) \sum_{i=0}^{h} b_i \cdot Q_i[(Sin\theta)^2]$$

then eliminating the first h derivatives of the respective relative gains $G_x$, $G_y$, about the center value $\cos \theta$ and about the center value $\sin \theta$ for $$\theta = \pi \frac{F_c}{F_e}$$

modifying $F_c$ slightly to obtain good rational approximations;

then using a standard algorithm to solve the system of 2h integer coefficient linear equations thus obtained; the solving of this system supplying respective coefficient values $a_0, \ldots, a_h$ and $b_0, \ldots, b_h$ as a function of $a_0$ and $b_0$ in rational form;

multiplying by the same integer factor all the coefficients $a_1, \ldots, a_{h-1}$ and $b_1, \ldots, b_{h-1}$ respectively, to obtain them in an integer form dependent on $a_0$, $b_0$, respectively;

calculating the value of $a_0$, $b_0$, respectively, such that the relative gains $G_x$ and $G_y$ are approximately equal for $$\theta = \pi \frac{F_c}{F_e}$$

with a given accuracy dependent on the application of the digitizer.

The above method is a general and rigorous method, so that the coefficients can be perfectly optimized according to the characteristics of an expected signal.

In a second aspect the invention consists in an analytical digitizer characterized in that the number 2h+2 of coefficients $a_0, \ldots, a_h$ and $b_0, \ldots, b_h$ and their value vary according to the center frequency $F_c$ and the bandwidth B of the spectrum of the signal to be processed;

and in that the means for supplying the values of the coefficients $a_0, \ldots, a_h, b_0, \ldots, b_h$ include:

means for incrementing the number h, starting from h=1, the number h being incremented subsequently under the control of an incrementing signal;

means for replacing the trigonometrical lines $\cos(2i+1)\theta$ and $\sin(2i+1)\theta$ for $i=0, \ldots, h$ with their respective standard polynomial expression in the form:

$$Cos(2i+1)\theta = (-1)^i (Cos\theta).Q_i[(Cos\theta)^2]$$

$$Sin(2i+1)\theta = (Sin\theta).Q_i[(Sin\theta)^2]$$

where $Q_i$ is a standard ith degree polynomial, in the following polynomials:

$$G_x = a_0 \cos \theta + a_1 \cos 3\theta + \ldots + a_i \cos(2i+1)\theta + \ldots + a_h \cos (2h+1)\theta$$

$$G_y = b_0 \sin \theta + b_1 \sin 3\theta + \ldots + b_i \sin(2i+1)\theta + \ldots + b_h \sin (2h+1)\theta$$

to obtain two polynomials which are the relative gains of the first and second calculating means and which are in the form:

$$Gx = (Cos\theta) \cdot \sum_{i=0}^{h} (-1)^i \cdot a_i \cdot Q_i[(Cos\theta)^2]$$

$$Gy = (Sin\theta) \sum_{i=0}^{h} b_i \cdot Q_i[(Sin\theta)^2]$$

means for eliminating the first h derivatives of the respective relative gains $G_x$, $G_y$, about the center value $\cos \theta$ and about the center value $\sin \theta$ for $$\theta = \pi \frac{F_c}{F_e};$$

means for using a standard algorithm to solve the two systems of 2h integer coefficient linear equations thus obtained; the solving of this system supplying respective coefficient values $a_1, \ldots, a_h$ and $b_1, \ldots, b_h$ as a function of $a_0$ and $b_0$ in rational form;

means for multiplying by the same integer factor all the coefficients $a_1, \ldots, a_h$ and $b_1, \ldots, b_h$, respectively, to obtain them in an integer form dependent on $a_0, b_0$, respectively;

means for calculating the value of $a_0, b_0$, respectively, such that the relative gains $G_x$ and $G_y$ of the first and second calculating means are approximately equal for $$\theta = \pi \frac{F_c}{F_e} ;$$

means for calculating an estimate of the quadrature signal/noise ratio equal to:

$$\frac{S}{N} = 4 \left[ \frac{G_y^2 + G_x^2}{G_y^2 - G_x^2} \right]^2$$

means for comparing this ratio to a predetermined limit value defining the minimal tolerable quadrature/signal noise ratio; said means supplying an incrementing signal to the means for incrementing the number h if the value of the ratio is less than the limit value or supplying a signal validating the current value of h and the coefficient values just determined if the value of said ratio is greater than or equal to the limit value.

This analytical digitizer is used to process a signal having varying characteristics since the number and value of the weighting coefficients vary according to these characteristics. The performance of this analytical digitizer can be optimal for each signal to be processed, since a calculating device can predetermine the values of the weighting coefficients when the characteristics of the signal to be processed change.

The invention will be better understood and other features of the invention will emerge from the following description of one embodiment of analytical digitizer in accordance with the invention.

DETAILED DESCRIPTION OF THE PREFERRED EMBODIMENT

Figure 1:
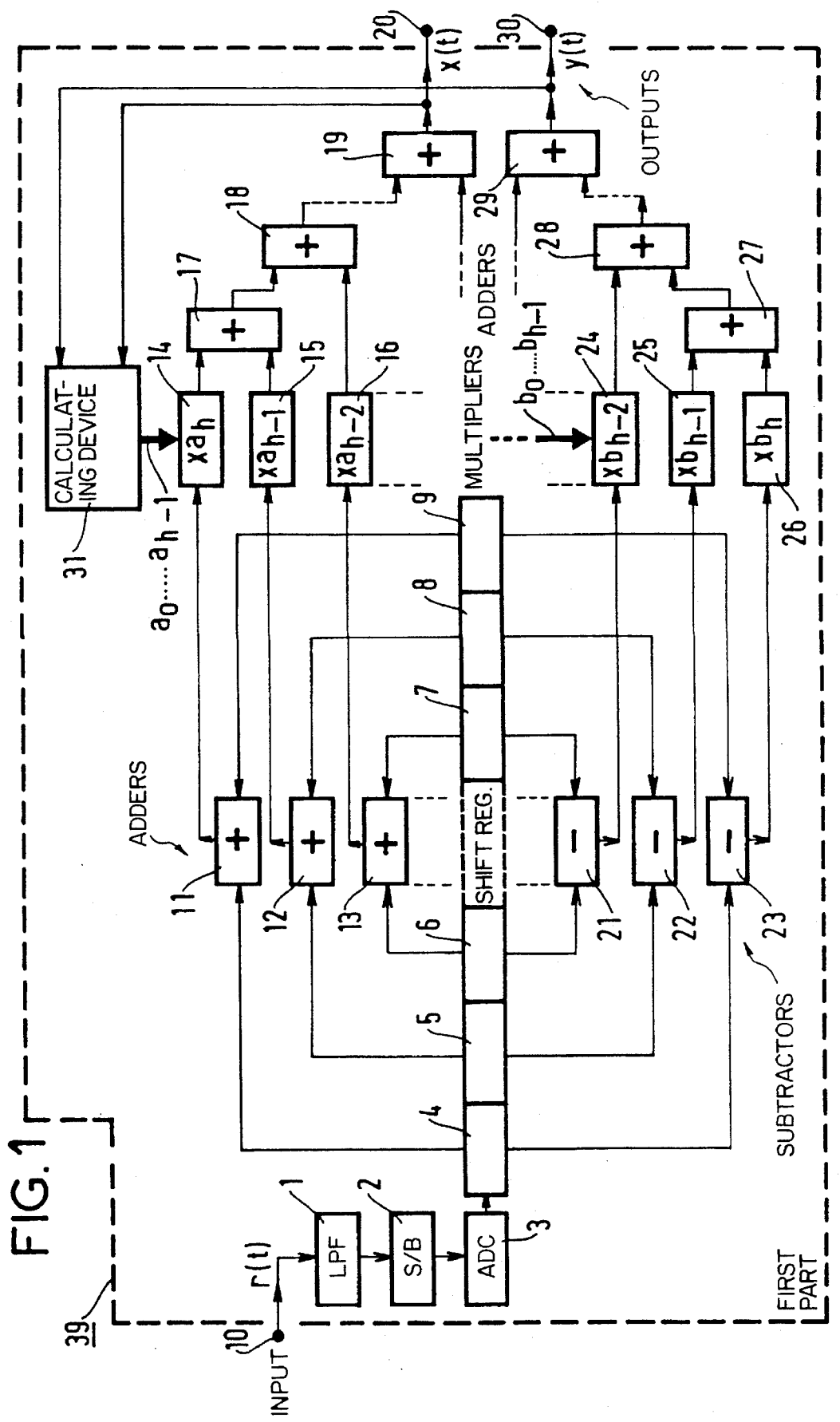
FIG. 1 shows the block diagram of part of this embodiment of the invention for determining a pair of values $x(t)$, $y(t)$.

The first part 39 whose block diagram is shown in FIG. 1 includes an input terminal 10 receiving a real analog signal $r(t)$ and two output terminals 20 and 30 respectively supplying first and second components of the signal in phase quadrature and respectively comprising a sequence of values $x(t)$ and a sequence of values $y(t)$ each represented by a binary word. This first part 39 calculates the values of $x(t)$ and $y(t)$ from the equations:

$$x(t) = a_0 \left[ r\left(t + \frac{\Delta t}{2}\right) + r\left(t - \frac{\Delta t}{2}\right) \right] + \tag{3}$$

-continued
$$a_1 \left[ R\left(t + \frac{3\Delta t}{2}\right) + r\left(t - \frac{3\Delta t}{2}\right) \right] + \ldots +$$
$$a_h \left[ r\left(t + \frac{(2h+1)\Delta t}{2}\right) + r\left(t - \frac{(2h+1)\Delta t}{2}\right) \right]$$

$$y(t) = b_0 \left[ r\left(t - \frac{\Delta t}{2}\right) - r\left(t + \frac{\Delta t}{2}\right) \right] +$$
$$b_1 \left[ r\left(t - \frac{3\Delta t}{2}\right) - r\left(t + \frac{3\Delta t}{2}\right) \right] + \ldots +$$
$$b_h \left[ r\left(t - \frac{(2h+1)\Delta t}{2}\right) - r\left(t + \frac{(2h+1)\Delta t}{2}\right) \right]$$

Theory shows that any continuous real signal $r(t)$ occupying a frequency band of bandwidth B can be uniformly represented by a sequence of complex samples of value $x(t)$, $y(t)$ with a temporal increment $$\Delta t = \frac{1}{B} ,$$

i.e. a calculation rate $F_e = B$, regardless of the center frequency $F_c$ of this real signal. It can be shown that the bandwidth usable to receive a signal is maximal if the center frequency of the received signal is equal to one quarter of the frequency at which the received signal is sampled. In practise the signal applied to the input terminal 10 has already undergone frequency conversion to realise this condition if it is a broadband signal so that this precaution must be taken to prevent its bandwidth exceeding the bandwidth usable by the analytical digitizer concerned.

The part 39 shown in FIG. 1 includes:
a bandpass filter 1 having a bandwidth equal to the maximal bandwidth of the signal applied to the input terminal 10;
a sampler-blocker 2;
an analog-digital converter 3;
a shift register having 2h+2 stages 4, 5, 6 . . . , 8, 9;
a series of adders comprising (h+1) adders 11, 12, 13, . . . ;
a series of subtractors comprising (h+1) subtractors 21, 22, 23 . . . ;
a first series of multipliers including (h+1) multiplexers 14, 15, 16, . . . ;
a second series of multipliers including (h+1) multipliers . . . , 24, 25, 26;
a second series of adders including h two-input adders 17, . . . , 19 connected in cascade to calculate the sum of (h+1) values respectively supplied at the outputs of the first series of multipliers 14, 15, 16, . . . ; the output of the adder 19 is connected to the output terminal 20;
a third series of two-input adders 27, 28, . . . , connected in cascade to calculate the sum of h+1 values supplied at respective outputs of the second series of multipliers 24, 25, 26, . . . ; the output of the adder 29 is connected to the output terminal 30;
a calculating device 31 having two inputs respectively connected to the outputs of the adders 19 and 29 and having a multiple output respectively connected to inputs of two series of multipliers 14, 15, 16, . . . , 24, 25, 26 to supply them respectively with weighting coefficient values $a_0, \ldots, a_h, b_0, \ldots, b_h$.

The part 39 calculates the pairs of values $x(t), y(t)$ at a rate Fe identical to the sampling and digitizing frequency. In other embodiments of the invention the sampling and digitizing frequency can be equal to a multiple of the calculation rate Fe so that the sampler-blocker 2 and the converter 3 can operate at a rate recommended by the manufacturer for optimal operation.

This embodiment is designed to allow automatic adaptation of the number and the value of the weighting coefficients according to the characteristics of the received signal and the required quadrature signal/noise ratio. For applications in which the characteristics of the received signal are constant or virtually constant another embodiment of the invention having a fixed number of coefficients and a fixed value for each coefficient can readily be deduced from the embodiment described here.

The block diagram shown in FIG. 1 is that of an embodiment implemented in discrete components, in order to illustrate the equations (3) used to calculate the values of the two components of the signal received. However, an alternative embodiment can include a processor programmed to carry out the same calculation.

In the embodiment shown in FIG. 1 the stages 4, 5, 6,.. ., 7, 8, 9 of the shift register memorize at time t the following sample values:

$$r\left(t+\frac{(2h+1)\Delta t}{2}\right)$$

$$r\left(t+\frac{(3\Delta t)}{2}\right)$$

$$r\left(t+\frac{\Delta t}{2}\right)$$

$$r\left(t-\frac{\Delta t}{2}\right)$$

$$r\left(t-\frac{(3\Delta t)}{2}\right)$$

$$r\left(t-\frac{(2h+1)\Delta t}{2}\right)$$

where $\Delta t$ is the sampling and digitizing period, which is equal to $1/Fe$ in this embodiment.

The adder 11 has two inputs respectively connected to outputs of the stages 4 and 9. The adder 12 has two inputs respectively connected to outputs of stages 5 and 8. The adder 13 has two inputs respectively connected to outputs of stages 6 and 7. Each adder of the series 11, 12, 13, etc adds two sample values which are symmetrical to the time t and in this way performs a kind of interpolation between two samples. The result of each of these interpolations is multiplied by a weighting coefficient $a_h$, $a_{h-1}$, $a_{h-2}$, etc by means of the multipliers 14, 15, 16, etc. The series of adders 17, 18, . . . , 19 adds the result of these multiplications to obtain the value x(t) according to equations (3).

The subtractor 23 has two inputs respectively connected to outputs of stages 4 and 9. The subtractor 22 has two inputs respectively connected to outputs of stages 5 and 8. The subtractor 21 has two inputs respectively connected to outputs of stages 6 and 7. Each of the subtractors 23, 22, 21, etc calculates the difference between two samples symmetrical to time t. The values of these differences are respectively multiplied by the weighting coefficients $b_h$, $b_{h-1}$, $b_{h-2}$, . . . , $b_0$ by means of the multipliers 26, 25, 24, etc. The results of these multiplications are added by the adders 27, 28, . . . , 29 to obtain the value y(t).

The device 31 receives the values x(t) and y(t) to calculate and optimize the weighting coefficients according to changes in the characteristics of the received signal. It determines integer values for the coefficients $a_0, \ldots, a_h, b_0, \ldots, b_h$ so that the equations (3) yield a pair of values x(t), y(t) representing the received signal r(t) with a given accuracy. This given accuracy is the minimal value of the quadrature signal/noise ratio considered sufficient for the intended application. The quadrature noise value is defined as the square of the amplitude of an error vector equal to the vector difference between the exact complex sample and the complex sample obtained from the equations (3) using the coefficients calculated by the device 31. Given this definition, the quadrature noise can usually be regarded as additive noise with a zero average and whose level is proportional to that of the signal to be processed.

To determine the number and the value of the weighting coefficients producing a quadrature signal/noise ratio greater than a fixed limit it is necessary to verify that the quadrature signal/noise ratio obtained using the calculated coefficients is greater than or equal to the fixed limit. For this verification the device 31 uses a property, based on the Weierstrass theorem and sampling theory, whereby any uniformly continuous function can be approximated with a given maximum error by a finite sum of sinusoids in the physical band. This theorem indicates that it is sufficient to optimize the coefficients of the analytical digitizer by considering only a finite number of sinusoids in the band of the signal to be processed. As the digitizer merely calculates linear combinations of sample values, it is possible to consider each of these sinusoids in succession to estimate the quadrature signal/noise ratio resulting from particular weighting coefficients.

Consider first the equations (3) on the hypothesis that the signal applied to the input terminal 10 is a simple sinusoid $r(t)=\cos(\overline{\omega}t+\psi)$:

$$x(t)=a_0\cdot\left[\cos\left(\overline{\omega}t+\overline{\omega}\frac{\Delta t}{2}+\phi\right)+\cos\left(\overline{\omega}-\frac{\overline{\omega}\cdot\Delta t}{2}+\phi\right)\right]+a_1\cdot\left[\cos\left(\overline{\omega}t+\overline{\omega}\cdot\frac{3\Delta t}{2}+\phi\right)+\phi\right]+ \quad (4)$$

$$\cos\left[\left(\overline{\omega}t-\overline{\omega}\cdot\frac{3\Delta t}{1}+\phi\right)\right]+\ldots+a_h\cdot\left[\cos\left(\overline{\omega}t+\frac{\overline{\omega}(2h+1)\Delta t}{2}+\phi\right)+\cos\left(\omega t-\frac{\omega(2h+1)\Delta t}{2}+\phi\right)\right]$$

$$y(t)=b_0\cdot\left[\cos\left(\overline{\omega}t-\overline{\omega}\frac{\Delta t}{2}+\phi\right)-\cos\left(\overline{\omega}t+\overline{\omega}\frac{\Delta t}{2}+\phi\right)\right]+b_1\cdot\left[\cos\left(\overline{\omega}t-\overline{\omega}\frac{3\Delta t}{2}+\phi\right)-\right.$$

$$\left.\cos\left(\overline{\omega}t+\frac{\overline{\omega}3\Delta t}{2}+\phi\right)\right]+\ldots+b_h\cdot\left[\cos\left(\overline{\omega}t-\frac{\overline{\omega}(2h+1)\Delta t}{2}+\phi\right)-\cos\left(\overline{\omega}t+\frac{\overline{\omega}(2h+1)\Delta t}{2}+\phi\right)\right]$$

These equations can be simplified by substituting:

$$\theta=\omega\cdot\frac{\Delta t}{2}=\pi\cdot\frac{Fc}{Fe}, \quad (5)$$

where Fc is the signal center frequency and $F_e$ is the rate at which the values x(t), y(t) are calculated.

The equations (4) then become:

$$x(t)=2[a_0\cos\theta+a_1\cos 3\theta+\ldots+a_i\cos(2i+1)\theta]\cos(\overline{\omega}t+\psi)$$

$$y(t)=2[b_0\sin\theta+b_1\sin 3\theta+\ldots+b_i\sin(2i+1)\theta]\sin(\overline{\omega}t+\psi) \quad (6)$$

It is seen that the two processing channels which calculate the values $x(t)$, $y(t)$ have respective relative gains $G_x$, $G_y$ depending on the weighting coefficients to be determined:

$$G_x=a_0\cos\theta+a_1\cos 3\theta+\ldots+a_i\cos(2i+1)\theta$$

$$G_y=b_0\sin\theta+b_1\sin 3\theta+\ldots+b_i\sin(2i+1)\theta \quad (7)$$

where $Q_i$ is a standard ith degree polynomial.

A simple way to determine these coefficients is to state that the gains $G_x$, $G_y$ must remain near a constant common value when the variable $\theta$ varies. The equations (7) giving the gain values $G_x$, $G_y$ as a function of the weighting coefficients can be written in a form embodying a polynomial in $\cos\theta$ for $G_x$ and a polynomial in $\sin\theta$ for $G_y$. For any integer value $i$ $\cos(2i+1)\theta$ and $\sin(2i+1)\theta$ can be written:

$$\cos(2i+1)\theta=(-1)^i(\cos\theta).Q_i[(\cos\theta)^2]$$

$$\sin(2i+1)\theta=(\sin\theta).Q_i[(\sin\theta)^2] \quad (8)$$

where $Q_i$ is a standard ith degree polynomial.

The gains $G_x$ and $G_y$ can therefore be written as follows:

$$G_x = (\cos\theta) \cdot \sum_{i=0}^{h} (-1)^i a_i \cdot Q_i[(\cos\theta)^2] \quad (9)$$

$$G_y = (\sin\theta) \sum_{i=0}^{h} b_i \cdot Q_i[(\sin\theta)^2]$$

Determining the weighting coefficients $a_i$ for $i=0$ through $h$ thus amounts to determining the coefficients of a polynomial in $\cos\theta$ such that this polynomial is practically constant about the value $\cos\theta$. Likewise determining the coefficients $b_i$ for $i=0$ through $h$ amounts to determining the coefficients of a polynomial in $\sin\theta$ such that this polynomial is practically constant about the value $\sin\theta$. If the number $(2h+2)$ of weighting coefficients is fixed a priori, the weighting coefficients can be determined in a single iteration. If not, several iterations may be necessary to determine weighting coefficients corresponding to increasing values of $h$, until an estimate of the quadrature signal/noise ratio is obtained which is greater than a given limit.

To determine the quadrature signal/noise ratio it is necessary to obtain a gain G common to the two processing channels:

$$G_x=G+\epsilon$$

$$G_y=G-\epsilon$$

The term $\epsilon$ represents the error between the respective relative gain $G_x$ and $G_y$ of each channel and the common gain G. The quadrature signal/noise ratio is then estimated from the equation:

$$\frac{S}{N} = \frac{G^2}{\epsilon^2} \cong 4\left[\frac{G_y^2+G_x^2}{G_y^2-G_x^2}\right]^2 \quad (10)$$

where $G_x$ and $G_y$ are the respective relative gains of the two channels for the value of $\theta$ corresponding to a frequency at the limit of the band in which the signal to be processed can be found.

Comparing this estimated value and a limit value indicates if the number $(2h+2)$ of samples and weighting coefficients determined is sufficient to obtain a quadrature signal/noise ratio sufficient for the intended application. If not, the number $h$ must be incremented and thus new values of the coefficients determined.

Figure 2:
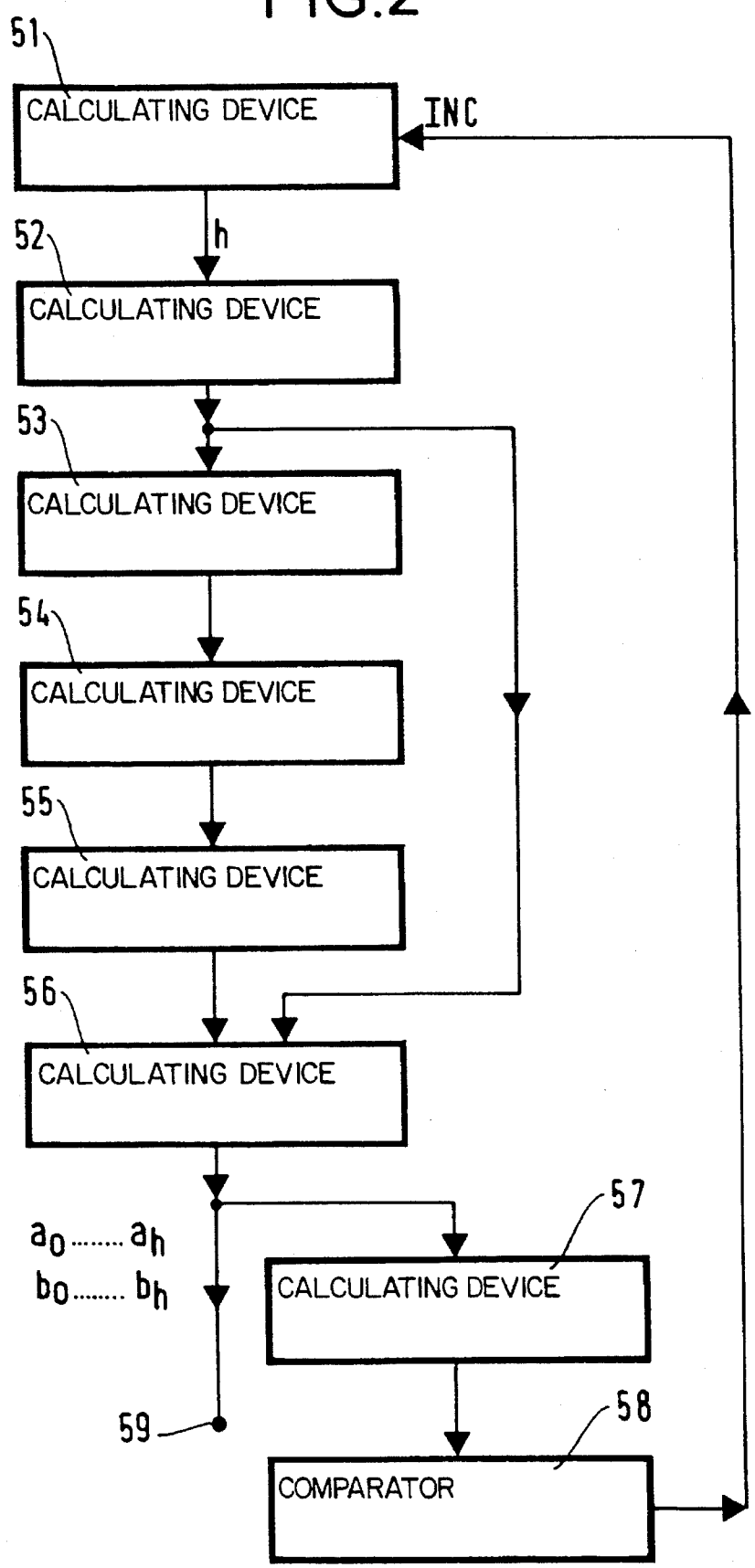
FIG. 2 shows the block diagram of another part of this embodiment of the invention for calculating the number $h+1$ and the value of the coefficients $a_0, \ldots, a_h$ and $b_0, \ldots, b_h$ according to the characteristics of the signal to be processed.

FIG. 2 shows the block diagram of one embodiment of the calculating device 31 for determining the number $(2h+2)$ of weighting coefficients and their values $a_0, \ldots a_h, b_0, \ldots, b_h$ for processing $2h+2$ sample values. This embodiment is made up of discrete calculating devices but could equally well be in the form of a suitably programmed processor. It includes:

a calculating device 51 for incrementing the number $h$ from an initial value $h=1$; the value of $h$ being incremented subsequently under the control of an incrementing signal INC if the estimate of the quadrature signal/noise ratio shows that it is below the given limit;

a calculating device 52 receiving the number $h$ supplied by the device 51 and for replacing the trigonometrical lines $\cos(2i+1)\theta$ and $\sin(2i+1)\theta$ for $i=0$ through $h$ by their respective standard polynomial expressions in the form (8) to obtain two polynomials in the form (9) giving the relative gains $G_x$ and $G_y$;

a calculating device 53 receiving the two polynomials (9) determined by the device 52 and calculating the first $2h$ derivatives of the two polynomials (9) and constituting a system of $2h$ integer coefficient linear equations, these first $2h$ derivatives cancelling out about respective values $\cos\theta$ for $G_x$ and $\sin\theta$ for $G_y$ for $$\theta = \frac{Fc}{Fe},$$

approximating the value of $\cos^2\theta$ by a rational fraction;

a calculating device 54 receiving this system of equations to solve it using a standard algorithm; solving this system of equations provides a value for each of the coefficients $a_1, \ldots, a_h, b_1, \ldots, b_h$ as a function of $a_0, b_0$, respectively, in rational form;

a calculating device 55 receiving the coefficient values calculated by the device 54 and multiplying them by a common factor so that they have an integer form dependent on $a_0$ and $b_0$, respectively; this common factor can be the lowest common multiple of the values obtained for the coefficients $a_1, \ldots, a_h$ and the coefficients $b_1, \ldots b_h$, respectively;

a calculating device 56 receiving the coefficient values calculated by the device 55 and receiving the equations (9) determined by the device 52 for calculating a value of $a_0, b_0$, respectively, such that the relative gains:

$$Gx = (\cos\theta) \cdot \sum_{i=0}^{h} (-1)^i a_i \cdot Q_i[(\cos\theta)^2] \quad (9)$$

$$Gy = (\sin\theta) \sum_{i=0}^{h} b_i \cdot Q_i[(\sin\theta)^2]$$

are approximately equal for $$\theta = \pi\frac{F_c}{F_e}$$

and deducing therefrom a value for each of the coefficients $a_0, \ldots, a_h, b_0, \ldots, b_h$;

a calculating device 57 receiving these coefficient values to calculate the quadrature signal/noise ratio from equation (10):

$$\frac{S}{N} = 4\left[\frac{G_y^2 + G_x^2}{G_y^2 - G_x^2}\right]^2 \quad (10)$$

a comparator 58 receiving the value of this ratio to compare this ratio to a predetermined limit value defining the minimal tolerable quadrature signal/noise ratio and supplying to the device 51 a signal INC for incrementing the value of h if the ratio is below the limit value or to validate the current value of h and the coefficient values just determined if the value of the ratio is greater than or equal to the limit value.

It can be shown that the previously mentioned polynomials $Q_i(x)$ have the following properties:

$$Q_0(x)=1 \quad (11)$$

$$Q_1(x)=3-4x \quad (12)$$

$$Q_2(x)=5-20x+16x^2 \quad (13)$$

$$Q_3(x)=7-56x+112x^2 \quad (14)$$

$$Q_i(x)=(1-2x).Q_{i-1}(x)+2(-1)^{i-1}.(1-x).Q_{i-1}(1-x) \quad (15)$$

These polynomials also have the following properties:

$$Q_i(0) = Q_{i-1}(0) + 2 \quad (16)$$

$$Q_i\left(\frac{1}{2}\right) = (-1)^{i-1} \cdot Q_{i-1}\left(\frac{1}{2}\right) \quad (17)$$

$$Q_i(1) = (-1)^i \quad (18)$$

Consider, for example, the use of this calculating device 31 when the current number h is equal to 2. To determine the weighting coefficients $a_0, a_1, a_2, b_2, b_0, b_1, b_2$ the device 52 substitutes in equations (2) for the general expression of the sample values:

$$r\left(t - \frac{\Delta t}{2}\right), r\left(t + \frac{\Delta t}{2}\right), r\left(t - \frac{3\Delta t}{2}\right),$$

$$r\left(t + \frac{3\Delta t}{2}\right), r\left(t - \frac{5\Delta t}{2}\right), r\left(t + \frac{5\Delta t}{2}\right),$$

with the values of the samples of a hypothetical sinusoid $r(t)=\cos(\overline{\omega}t+\psi)$, and then setting $$\theta = \frac{\overline{\omega}\Delta t}{2}.$$

The equations (9) for the gains $G_x$ and $G_y$ then assume the following form, in this example:

$$G_x = \cos\theta[a_0 - a_1(3-4\cos^2\theta) + a_2(5-20\cos^2\theta+16\cos^4\theta)]$$

$$G_y = \sin\theta[b_1 + b_1(3-4\sin^2\theta) + b_2(5-20\sin^2\theta+16\sin^4\theta)] \quad (19)$$

To determine the values of the coefficients $a_0, a_1, a_2, b_0, b_1, b_2$ which produce approximately equal values of the gains $G_x$ and $G_y$, the device 53 cancels the first two derivatives of each of the polynomials (19). The $3x_i$ are solutions of a homogeneous system of two equations. The $3b_i$ are solutions of a system of the same type with $b_i$ replaced with $(-1)^i.b_i$ and $\cos\theta$ with $\sin\theta$.

$$a_0 - 3a_1 + 5a_2 + (12.a_1 - 60.a_2)\cos^2\theta + 80.a_2\cos^4\theta = 0$$

$$3a_1 - 15a_2 + 40.a_2.\cos^2\theta = 0$$

$$b_0 + 3b_1 + 5b_2 - (12b_1 + 60.b_2)\sin^2\theta + 80.b_2.\sin^4\theta = 0 \quad (20)$$

$$2b_1 + 15b_2 - 40.b_2 - 40.b_2.\sin_2\theta = 0$$

The device 54 determines the solution of this system of equations to the nearest multiplication constant for $a_0, a_1, a_2$ and to the nearest multiplication constant for $b_0, b_1, b_2$. This solution is as follows:

$$a_0 = 10 - 40\cos^2\theta + 80\cos^4\theta \quad (21)$$

$$a_1 = 5 - \frac{40\cos^2\theta}{3}$$

$$a_2 = 1$$

$$b_0 = 10 - 40\sin^2\theta + 80\sin^4\theta \quad (22)$$

$$b_1 = -5 + \frac{40}{3}\sin^2\theta$$

$$b_2 = 1$$

To determine the two multiplication constants the device 55 inserts this solution into the equations (19) which become:

$$Gx = \left(96 - \frac{160}{3}\right)\cos^5\theta \quad (23)$$

$$Gy = \left(96 - \frac{160}{3}\right)\sin^5\theta$$

The device 55 determines a factor for multiplying $a_0, a_1, a_2$ and a factor for multiplying $b_0, b_1, b_2$.

For the two gains to be equal, for the center value $\theta$, the coefficients $a_0, a_1, a_2$ given by the equations (21) must be multiplied by $\sin^5\theta$ and the coefficients $b_0, b_1, b_2$ given by the equations (22) must be multiplied by $\cos^5\theta$.

Given these multiplication constants, the values of the coefficient are therefore:

$$a_0 = (10 - 40\cos^2\theta + 80\cos^4\theta)\sin^5\theta \quad (24)$$

$$a_1 = \left(5 - \frac{40}{3}\cos^2\theta\right)\sin^5\theta$$

$$a_2 = \sin^5\theta$$

$$b_0 = (10 - 40\sin^2\theta + 80\sin^4\theta)\cdot\cos^5\theta$$

$$b_1 = \left(-5 + \frac{40}{3}\sin^2\theta\right)\cos^5\theta$$

$$b_2 = \cos^5\theta$$

The device 56 then substitutes for $\theta$ its value:

$$\theta = \omega \cdot \frac{\Delta t}{2} = \pi \cdot \frac{Fc}{Fe},$$

and rounds off $\cos\theta$ and $\sin\theta$ to rational values to obtain a rational value for each coefficient, on output 59.

Note that $F_c$ can be modified slightly to simplify the values of the coefficients of the analytical head.

For example, if the analytical head is intended to digitize a signal centered on the frequency $F_c=1.6$ kHz and if the rate at which the pairs of values x(t), y(t) is calculated is $F_e=8$ kHz, then 8 is approximately equal to 0.628 rd and $\cos\theta$ is approximately equal to 0.809. To simplify the implementation the value of $\cos\theta$ is taken as equal to a rational value near 0.809, for example 4/5. Likewise, the value of $\sin\theta$ is taken as equal to the rational value 3/5.

Inserting these values in the equations (24) and multiplying by appropriate multiplier factors, the values of coefficients become the following integer values:

$a_0=4172$  $a_1=-859$  $a_2=243$ $b_0=6111$  $b_1=-205$  $b_2=1024$

In the specific case where $$F_c = \frac{F_e}{4} \text{ and } \theta = \frac{\pi}{4}$$

the equations (24) give: $a_0=b_0=30$, $a_1=-b_1=-5$, $a_2=b_2=3$.

These values are very simple and is therefore beneficial to convert the frequency of a received signal so that this condition is satisfied, in order to simplify the implementation of the calculating means which carry out the multiplication by these coefficients. This is a general property which is true regardless of the number of coefficients used.

For example, consider calculation of the signal/noise ratio for the case in which the digitizer of the invention uses four samples. The calculation method described above yields:

$a_0=3$ $a_1=-1$
$b_0=3$ $b_1=1$
$G_x=3 \cos\theta - 2 \cos^3\theta$
$G_y=3 \sin\theta - 2 \sin^3\theta$ The signal/noise ratio S/N is then obtained from the equations (10) by substituting $$\frac{\pi}{2} \cdot \frac{\Delta F}{F_c}$$

for $\theta$ where $\Delta F$ is the half-band occupied by the signal to be processed and $F_c$ is the center frequency of this signal:

$$\frac{S}{N} = 4\left[\frac{G_x^2 + G_y^2}{G_y^2 - G_x^2}\right] = 4\left[\frac{1 + 3\cos^2\frac{\pi}{2} \cdot \frac{\Delta F}{F_c}}{\sin^3\frac{\pi}{2} \cdot \frac{\Delta F}{F_c}}\right]^2$$

For example, for $$\frac{\Delta F}{F_c} = 0.55 \quad \frac{S}{N} = 20 \text{ dB}$$

Figure 3:
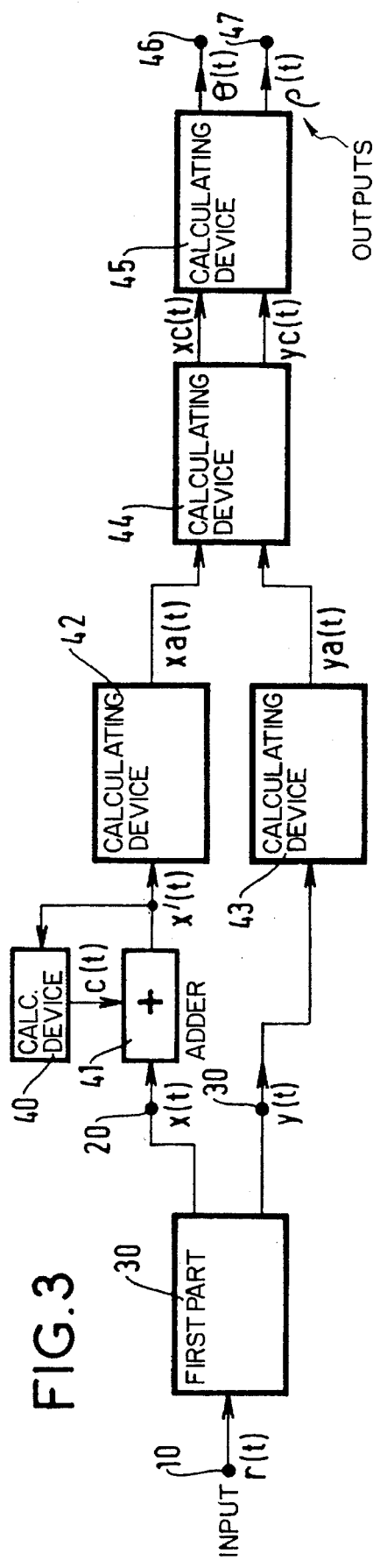
FIG. 3 shows a block diagram of all of this embodiment of the invention.

FIG. 3 shows the complete block diagram of this embodiment of analytical digitizer of the invention. It includes:

a first part 39 which is that whose block diagram is shown in FIG. 1 and which supplies the Cartesian values x(t), y(t) of the first and second components of the received signal;

a calculating device 40 which carries out statistical processing to produce a zero correction signal c(t);

an adder 41 having an input connected to an output of the device 40 and an input connected to the output terminal 20 of the part 39 to add algebraically the value c(t) of the correction signal to the value x(t); an output of the adder 41 supplying a corrected value x'(t) to an input of the device 40;

a calculating device 42 having an input connected to the output of the adder 41 and an output supplying a rounded value xa(t) deduced from the value x'(t);

a calculating device 43 having an input connected to the output terminal 30 of the part 39 and an output supplying a rounded value ya(t) deduced from the value y(t);

a calculating device 44 for increasing the dynamic range of the analytical digitizer; having two inputs respectively connected to the outputs of the calculating devices 42 and 43 and two outputs respectively supplying two values xc(t) and yc(t);

a calculating device 45 for converting the Cartesian values of the components xc(t) and yc(t) into two polar values $\theta$(t) and $\rho$(t) which are supplied to respective output terminals 46 and 47 of the analytical digitizer.

The calculating devices 40 through 45 can be implemented as a single suitably programmed processor.

The component y(t) does not include any continuous component because the values of the weighting coefficients used for this component are antisymmetrical. On the other hand, the component x(t) can include a continuous component due to a zero error. In the analytical digitizer of the invention it is easy to correct this zero error. It does not require any complex control function. The value c(t) of a correction signal is added to each value x(t) by the adder 41. The value c(t) of the correction signal is evaluated by the calculation device 40, for example by calculating the mean value of x'(t) for 1 000 samples. The zero error drifts slowly which means that the value of the correction signal can be calculated cyclically rather than continuously.

The calculating devices 42 and 43 reduce the number of bits of the two binary words respected representing the values x'(t) and y(t). For example, the number of bits for these values is increased from 8 bits to 11 bits at the stage of the multiplications carried out by the multipliers 14, 15, 16, . . . , 24, 25, 26 shown in FIG. 1. It is desirable to reduce this unnecessarily large number of bits to a value (8 bits) which is suitable for the dynamic range of the signal concerned and which is easy to process using conventional digital calculating devices. The calculating devices 42 and 43 eliminate 3 bits but round to the nearest binary value in order to retain the highest possible accuracy.

To reduce from 11 to 8 the number of bits in a first binary word representing the value x'(t), for example, the device 42 forms a second binary word by truncating the three least significant bits of the first binary word. It forms a third binary word by truncating the three least significant bits in the first binary word and then increases the value of this third binary word by one unit. It compares the value x'(t) with that of the second binary word and that of the third binary word and then chooses either the second binary word or the third binary word, whichever has a value closer to the value x'(t) of the first binary word.

The calculating device 44 increases (approximately doubles) the dynamic range of the analytical digitizer without it being necessary to increase the number of weighting coefficients. For a signal occupying a narrow band centered on a frequency $F_1$, the digitizer can be shown to create a spurious signal occupying a narrow band centered on the frequency $-F_1$. In the usual case where the calculation rate $F_e$ is four times the center frequency $F_c$ of the received signal, the spurious signal appears at a frequency symmetrical to the frequency $F_1$ about the center frequency $F_c$ of the received signal. It is thus possible to determine the center frequency of this spurious signal and to eliminate it by means of conventional digital filtering.

The calculating device 45 determines the spectrum of the signal represented by the values xc(t), yc(t). It determines the frequency component in the spectrum having the greatest amplitude. It eliminates the component symmetrical to this component about the center frequency $F_c$ of the received signal using a digital bandstop filter centered on the frequency of the symmetrical component. It determines a new component having the greatest amplitude, not already processed, and then eliminates the component symmetrical to this new component about the center frequency $F_c$ of the received signal. It reiterates this process until all the components with an amplitude greater than a fixed value have been processed.

The calculating device 45 converts the Cartesian co-ordinates $x_c(t)$, $y_c(t)$ into polar co-ordinates $\theta(t)$, $\rho(t)$ by particularly fast and simple means. The value $\theta(t)$ is theoretically equal to arctan $$\frac{y_c(t)}{x_c(t)}.$$

The value of θ(t) is conventionally calculated by dividing y(t) by x(t), using logic gates or a processor, and then looking up a table of values of θ using the result of this division. The device 45 determines the value of θ by a different, faster and simpler method avoiding dividing $y_c(t)$ by $x_c(t)$.

This method retains only s meaningful bits of the absolute value and a sign bit for the values $x_c(t)$ and $y_c(t)$; s is a fixed number and the s bits retained have the same rank in the binary words representing these two values; the meaningful bits eliminated are always the least significant bits.

The method then concatenates these two 2s significant bits to constitute an address; it then addresses a read-only memory holding $2^{2s}$ approximate values of θ, to read off a value of θ. This read-only memory (not shown) is an integral part of the device 45.

For example, if s is equal to 4 and if:

xc(t)=0 0<u>100</u> 0
yc(t)=0 <u>110</u>1 1 the device 45 retains the four bits underlined. The leftmost bit is eliminated as it is not meaningful for either of the two values. The rightmost bit is eliminated as the number s of bits to be retained has been set at 4.

The concatenation of the 2s bits retained supplies an address on 8 bits only:

01001101 which is used to read an approximate value of:

$$\theta = \arctan \frac{y_c(t)}{x_c(t)}$$

in a read-only memory. Having eight-bit addresses, this memory has a much smaller capacity than if it were addressed by the values $x_c(t)$ and $y_c(t)$ which are represented by 16 bits in total.

Figure 4:
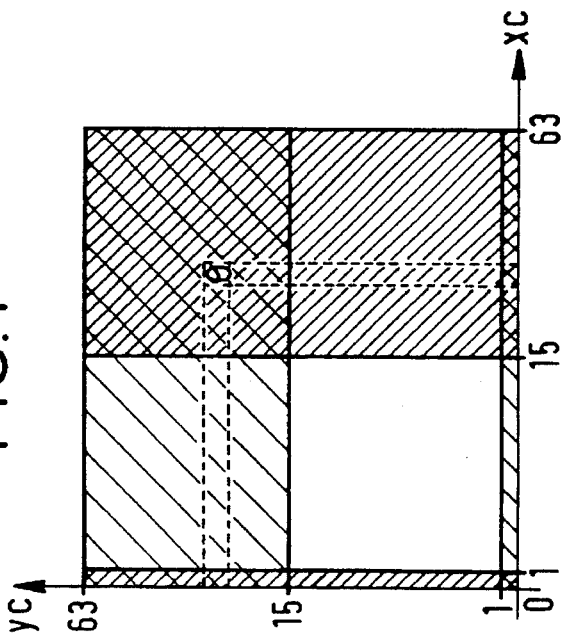
FIG. 4 shows a graph illustrating the operation of part of this embodiment of the invention.

FIG. 4 shows this method of determining θ. It shows the field of all possible values $x_c(t)$ and all possible values $y_c(t)$. The field of addresses that are actually used is shown white and the field of addresses that are never used is shown shaded. In this example the memory capacity actually used is less than one quarter of the capacity that would be needed if all the bits of $x_c(t)$ and $y_c(t)$ were used. Eliminating the rightmost bit renders inaccessible the values of θ corresponding to $x_c$=0 or 1 and the values $Y_c$=0 or 1. Eliminating the leftmost bit renders inaccessible the values of θ corresponding to $x_c$=16 to 63 and $Y_c$=16 to 63.

In practise it is possible to limit the sampling frequencies $F_e$ so that $$\frac{F_c}{F_e} = \pm \frac{1}{4} + k$$

where k is a positive integer or zero. Quadrature noise theory shows that the quadrature signal/noise ratio depends only on the ratio of the useful bandwidth divided by the sampling frequency.

Thus it is possible to demodulate a 4-phase signal at 300 Mbit/s (i.e. 150 Megasymbols per second) occupying a bandwidth of 150 MHz by sampling at 450 MHz (i.e. an analytical pair outside the transitions) provided that a center (intermediate) frequency near $$\left(5 + \frac{1}{4}\right) 150 \text{ MHz},$$

i.e. 788 MHz, is used.

The quadrature gains are:
$G_x = a_0 \cos \theta + a_1 \cos 3\theta + \ldots + a_h \cos(2h+1)\theta$
$G_y = b_0 \sin \theta + b_1 \sin 3\theta + \ldots + b_h \sin(2h+1)\theta$ The conditions of symmetry of the problem relative to $$\theta = \pm \frac{\pi}{4}$$

show that $a_i = (-1)^i b_i$.

$$\cos(2h+1)\theta = (\cos\theta)(-1)^h Q_h(\cos^2\theta) = \frac{1}{\sqrt{2}} (-1)^h Q_h$$

$$\sin(2h+1)\theta = (\sin\theta) Q_h(\cos^2\theta) = \frac{1}{\sqrt{2}} Q_h$$

where $$Q_h = Q_h\left(\frac{1}{2}\right) = (-1)^{h-1} Q_{h-1} \text{ and } |Q_h| = 1$$

| i = | 0 | 1 | 2 | 3 | 4 | 5 | 6 | 7 |
|---|---|---|---|---|---|---|---|---|
| $Q_i =$ | 1 | 1 | −1 | −1 | 1 | 1 | −1 | −1 |

The values of $b_i$ are determined to the nearest multiplication constant by eliminating the first h derivatives of $G_y$ with respect to θ. For G'y:

$b_0 \cos \theta + 3b_1 \cos 3\theta + 5b_2 \cos 5\theta = 0$
$b_0 - 3b_1 Q_1 + 5b_2 Q_2 = 0$
$b_0 - 3b_1 - 5b_2 = 0$ For G"y:

$b_0 \sin \theta + 9b_1 \sin 3\theta + 25b_2 \sin 5\theta = 0$
$b_0 Q_0 + 9b_1 Q_1 + 25 b_2 Q2 = 0$
$b_0 + 9b_1 - 25 b_2 = 0$ The minimal integer solution is as follows:

$b_0 = 30, b_1 = 5, b_2 = 3$
$a_0 = 30, a_1 = -5, a_2 = 3$

It is therefore easy to precalculate the lists of coefficients $b_i$ and to store them in a table which can be looked up during the analytical head adaptation process. Of course, an evaluation of the quadrature noise as a function of bandwidth could be added to this table for each list of coefficients.

There is claimed:

1. Method of calculating weighting coefficients for an analytical digitizer for signal processing, said digitizer comprising:

means for sampling an analog signal to be processed and for converting the analog value of each sample into a digital value;

first calculating means supplying a sequence of digital values x(t) each calculated by adding 2h+2 values supplied by the digitizing means weighted by respective non-null integer coefficients $a_0, \ldots, a_h, a_h, \ldots, a_0$;

second calculating means supplying a sequence of digital values y(t) each calculated by adding 2h+2 values supplied by the digitizing means weighted by respective non-null integer coefficients $b_0, \ldots, b_h, -b_h, \ldots, -b_0$;

means for supplying to said first and second calculating means the values of the coefficients $a_0, \ldots, a_h, b_0, \ldots, b_h$;

wherein, for a digitizer calculating pairs of values x(t), y(t) at a fixed rate Fe for a signal having a predetermined center frequency Fc and bandwidth B and for a predetermined number h, the calculation of the coefficients $a_0, \ldots, a_h$ and $b_0, \ldots, b_h$ consists in:

replacing the trigonometrical lines $\cos(2i+1)\theta$ and $\sin(2i+1)\theta$ for $i=0, \ldots, h$, respectively, by standard polynomial expressions of the respective form:

$$\text{Cos}(2i+1)\theta = (-)^i (\text{Cos}\theta) \cdot Q_i[(\text{Cos}\theta)^2]$$

$$\text{Sin}(2i+1)\theta = (\text{Sin}\theta) \cdot Q_i[(\text{Sin}\theta)^2]$$

where Qi is a standard ith degree polynomial; in the following polynomials:

$$G_x = a_0\cos\theta + a_1\cos 3\theta + \ldots + a_i\cos(2i+1)\theta + \ldots + a_h\cos(2h+1)\theta$$

$$G_y = b_0\sin\theta + b_1\sin 3\theta + \ldots + b_i\sin(2i+1)\theta + \ldots + b_h\sin(2h+1)\theta$$

to obtain two polynomials called the relative gains of the first and second calculating means, in the form:

$$Gx = (\text{Cos}\theta) \cdot \sum_{i=0}^{h} (-1)^i \cdot a_i \cdot Q_i \cdot [(\text{Cos}\theta)^2]$$

$$Gy = (\text{Sin}\theta) \cdot \sum_{i=0}^{h} b_i \cdot Q_i \cdot [(\text{Sin}\theta)^2]$$

then eliminating the first h derivatives of the respective relative gains $G_x$, $G_y$, about the center value $\cos\theta$ and about the center value $\sin\theta$ for $$\theta = \pi \frac{F_c}{F_e},$$

approximating $\cos^2\theta$ by means of a rational fraction;

then using a standard algorithm to solve the system of 2h integer coefficient linear equations thus obtained; the solving of this system supplying respective coefficient values $a_0, \ldots, a_h$ and $b_0, \ldots, b_h$ as a function of $a_0$ and $b_0$ in rational form;

multiplying by the same integer factor all the coefficients $a_1, \ldots, a_h$ and $b_1, \ldots, b_h$, respectively, to obtain them in an integer form dependent on $a_0$, $b_0$, respectively;

calculating the value of $a_0$, $b_0$, respectively, such that the relative gains $G_x$ and $G_y$ are approximately equal for $$\theta = \pi \frac{F_c}{F_e}$$

with a given accuracy dependent on the application of the digitizer.

2. Analytical digitizer for signal processing comprising:

means for sampling an analog signal to be processed and for converting the analog value of each sample into a digital value;

first calculating means supplying a sequence of digital values x(t) each calculated by adding 2h+2 values supplied by the digitizing means weighted by respective non-null integer coefficients $a_0, \ldots, a_h, a_h, \ldots, a_0$;

second calculating means supplying a sequence of digital values y(t) each calculated by adding 2h+2 values supplied by the digitizing means weighted by respective non-null integer coefficients $b_0, \ldots, b_h, -b_h, \ldots, -b_0$;

means for supplying to said first and second calculating means the values of the coefficients $a_0, \ldots, a_h, b_0, \ldots, b_h$;

wherein the number 2h+2 of coefficients $a_0, \ldots, a_h, b_0, \ldots, b_h$, and their values vary according to the center frequency $F_c$ of the signal and the bandwidth B of the spectrum of the signal to be processed;

and in that the means for supplying the values of the coefficients $a_0, \ldots, a_h, b_0, \ldots, b_h$ include:

means for incrementing the number h, starting from h=1, the number h being incremented subsequently under the control of an incrementing signal;

means for replacing the trigonometrical lines $\cos(2i+1)v$ and $\sin(2i+1)\theta$ for $i=0, \ldots, h$ with their respective standard polynomial expression in the form:

$$\text{Cos}(2i+1)\theta = (-1)^i (\text{Cos}\theta) \cdot Q_i[(\text{Cos}\theta)^2]$$

$$\text{Sin}(2i+1)\theta = (\text{Sin}\theta) \cdot Q_i[(\text{Sin}\theta)^2]$$

where $Q_i$ is a standard ith degree polynomial, in the following polynomials:

$$G_x = a_0\cos\theta + a_1\cos 3\theta + \ldots + a_i\cos(2i+1)\theta + \ldots + a_h\cos(2h+1)\theta$$

$$G_y = b_0\sin\theta + b_1\sin 3\theta + \ldots + b_i\sin(2i+1)\theta + \ldots + b_h\sin(2h+1)\theta$$

to obtain two polynomials which are the relative gains of the first and second calculating means and which are in the form:

$$Gx = (\text{Cos}\theta) \cdot \sum_{i=0}^{h} (-1)^i \cdot a_i \cdot Q_i \cdot [(\text{Cos}\theta)^2]$$

$$Gy = (\text{Sin}\theta) \sum_{i=0}^{h} b_i \cdot Q_i[(\text{Sin}\theta)^2]$$

means for eliminating the first h derivatives of the respective relative gains $G_x$, $G_y$, about the center value $\cos\theta$ and about the center value $\sin\theta$ for $$\theta = \pi \frac{F_c}{F_e},$$

approximating $\cos^2\theta$ by means of a rational fraction;

means for using a standard algorithm to solve the system of 2h integer coefficient linear equations thus obtained; the solving of this system supplying respective coefficient values $a_1, \ldots, a_h$ and $b_1, \ldots, b_h$ as a function of $a_0$ and $b_0$ in rational form;

means for multiplying by the same integer factor all the coefficients $a_1, \ldots, a_h$ and $b_1, \ldots, b_h$, respectively, to obtain them in an integer form dependent on $a_0$, $b_0$, respectively;

means for calculating the value of $a_0$, $b_0$, respectively, such that the relative gains $G_x$ and $G_y$ of the first and second calculating means are approximately equal for $$\theta = \pi \frac{F_c}{F_e};$$

means for calculating an estimate of the quadrature signal/noise ratio equal to:

$$\frac{S}{N} = 4 \left[ \frac{G_y^2 + G_x^2}{G_y^2 - G_x^2} \right]^2$$

means for comparing this ratio to a predetermined limit value defining the minimal tolerable quadrature/signal noise ratio and for supplying an incrementing signal to the means for incrementing the number h if the value of the ratio is less than the limit value or supplying a signal validating the current value of h and the coefficient values just determined if the value of said ratio is greater than or equal to the limit value.

3. Digitizer according to claim 2 wherein the first calculating means further comprise:

means for estimating a zero error over a series of values of x(t) of the first component and supplying a correction signal having a value $_c(t)$;

means for adding the value $_c(t)$ of the correction signal to each value of x(t) calculated by the first calculating means.

4. Digitizer according to claim 2 wherein each of the first and second calculating means further include means for reducing the number of bits of a first binary word representing the absolute value of x(t), y(t), respectively said means for reducing the number of bits including means for:

forming a second binary word by truncating b least significant bits from the first binary word where b is a fixed number;

forming a third binary word by truncating b least significant bits from the first binary word and then incrementing its value by unity;

comparing the value x(t), y(t), respectively, with the values of the second and third binary words;

representing the value of x(t), y(t), respectively, by whichever has the value nearer the value of the first binary word.

5. Digitizer according to claim 2 wherein to increase the dynamic range of the digitizer the first and second calculating means further include means for:

calculating the amplitude of the spectral components of the signal to be treated from the values x(t), y(t) determined by the first and second calculating means;

determining which of these components has the highest amplitude;

eliminating the component symmetrical to said highest amplitude component about the center frequency $F_c$ of the signal;

determining a new, as yet unprocessed component of greatest amplitude;

eliminating the component symmetrical to said new component about the center frequency $F_c$ of the signal;

reiterating this process until all components of amplitude greater than a fixed value have been processed.

6. Digitizer according to claim 2 wherein the first and second calculating means further include means for converting each pair of values x(t), y(t) into two polar co-ordinates $\rho$ and $\theta$;

characterized in that, to calculate $\theta$, said converter means include means for:

retaining only s absolute value bits and one sign bit for the value x(t), y(t), respectively, s being a fixed number, the s bits retained having the same rank in the value of x(t) and in the value of y(t), and the bits not retained being in all cases the least significant bits;

concatenating these $2^2s$ bits to constitute an address;

and include a read-only memory containing $2^2s$ approximate values of $\theta$ addressed by means of said address to read therein a value $\theta$ for each pair of values x(t), y(t).

7. Digitizer according to claim 2 wherein the calculating rate $F_e$ and the center frequency $F_c$ of the signal received are related by the equation $$\frac{F_c}{F_e} = \pm \frac{1}{4} + k$$

where k is a positive integer or zero.

* * * * *